United States Patent [19]
Casey et al.

[11] Patent Number: 5,635,000
[45] Date of Patent: Jun. 3, 1997

[54] METHOD FOR SCREENING USING ELECTROSTATIC ADHESION

[75] Inventors: Jon A. Casey, Poughkeepsie; Cynthia J. Calli; Darren T. Cook, both of Newburgh; David B. Goland, Croton-on-Hudson; John U. Knickerbocker, Hopwell Junction; Mark J. LaPlante, Walden; David C. Long, Wappingers Falls; Daniel S. Mackin, Pleasant Valley; Kathleen M. McGuire, Walkill; Keith C. O'Neil, Hughsonville; Kevin M. Prettyman, Holmes; Michael T. Puchalski, Carmel; Joseph C. Saltarelli, Poughkeepsie; Candace A. Sullivan, Pleasant Valley, all of N.Y.

[73] Assignee: International Business Machines Corporation, Armonk, N.Y.

[21] Appl. No.: 577,180

[22] Filed: Dec. 22, 1995

[51] Int. Cl.⁶ .......................... B32B 31/04; B32B 31/28
[52] U.S. Cl. .................. 156/89; 156/235; 156/239; 156/249; 156/252; 156/272.2; 156/289; 156/344; 29/830; 29/831; 29/837; 264/430
[58] Field of Search ..................... 156/235, 239, 156/249, 252, 272.2, 289, 344; 29/830, 831, 837; 264/58, 61, 67

[56] References Cited

U.S. PATENT DOCUMENTS

| | | |
|---|---|---|
| 3,892,614 | 7/1975 | Levy . |
| 3,948,706 | 4/1976 | Schmeckenbecher ............... 156/89 |
| 4,407,007 | 9/1983 | Desai ............................ 174/257 |
| 4,457,972 | 7/1984 | Griffith et al. . |
| 4,510,000 | 4/1985 | Kumar ........................... 156/89 |
| 4,546,065 | 10/1985 | Amendola ...................... 430/5 |
| 4,753,694 | 6/1988 | Herron .......................... 156/89 |
| 5,167,997 | 12/1992 | Chamberlain et al. . |
| 5,262,207 | 11/1993 | Garner et al. . |
| 5,356,497 | 10/1994 | Lee . |
| 5,480,503 | 1/1996 | Casey ........................... 156/89 |

OTHER PUBLICATIONS

K. S. Desai et al., "Backing Material for MLC Screening", IBM Technical Disclosure Bulletin, vol. 24, No. 10 p. 5119 Mar. 1982.

*Primary Examiner*—Patrick Ryan
*Assistant Examiner*—Patrick Jewik
*Attorney, Agent, or Firm*—Aziz M. Ahsan

[57] ABSTRACT

The present invention relates generally to a new apparatus and method for screening using electrostatic adhesion. More particularly, the invention encompasses an apparatus that uses an electrostatic charge during the screening process for a semiconductor substrate. Basically, a backing layer is adhered to a green ceramic sheet using an electrostatic charge, while the green ceramic sheet is processed.

7 Claims, 2 Drawing Sheets

METHOD FOR SCREENING USING ELECTROSTATIC ADHESION

FIELD OF THE INVENTION

The present invention relates generally to a new apparatus and method for screening using electrostatic adhesion. More particularly, the invention encompasses an apparatus that uses an electrostatic charge during the screening process for a semiconductor substrate. Basically, a backing layer is adhered to a green ceramic sheet using an electrostatic charge, while the green ceramic sheet is processed.

BACKGROUND OF THE INVENTION

Semiconductor devices are becoming smaller and more dense with the evolution of new technology. Therefore, there is a pressure for this industry to constantly make improvements and innovation in this technology. The semiconductor manufacturers are therefore constantly being challenged to improve the quality of their products by identifying and eliminating defects and to make improvements where necessary. Whereas significant improvements are being made to eliminate systematic defects by reducing process variability. Process improvements alone are not sufficient to eliminate all the random defects which effect both yield and reliability. Historically, inspection techniques have been employed to improve product failure rates to acceptable levels by culling out many of these random defects.

Similarly, in the fabrication of ceramic substrates, such as, multilayer ceramic (MLC) substrates, the formation of vias is critical to the electrical performance of the final substrate. Vias can be formed by a number of methods. The most popular method of forming vias in ceramic green sheets is by punching or drilling holes through the individual green sheets and filling these holes with a metallurgical paste that is electrically conductive.

These individual green sheets are then laminated by methods well known in the art and the green sheet laminates are then processed through a furnace. After sintering of the laminated green sheets and the subsequent formation of a ceramic substrate, the vias containing the metal form an electrical path between the various layers on the substrate.

U.S. Pat. No. 3,892,614 (Levy), discloses a electrostatic laminating apparatus and method in which two or more sheets to be pinned together are passed in close proximity or in contact with each other through an electric field and the resulting electrostatic charge pins these two sheets together.

U.S. Pat. No. 4,457,972 (Griffith), teaches adhesion of layers using high energy bombardment. Basically, films are firmly bonded to insulator substrates by irradiating the interface with high energy ions.

U.S. Pat. No. 5,167,997 (Chamberlain), discloses the formation of protected conductive foil assemblage using static electrical forces. A plastic film is removably joined with an electrically conductive foil. The absence of air between the film and the foil is produced by oppositely statically electrically charging the film and the foil such that they are forced together sufficiently to squeeze the air out from therebetween.

IBM Technical Disclosure Bulletin, "Backing Material For MLC Screening", Vol. 24, No. 10, page 5119 (March 1982), teaches that backing material is typically employed in the MLC (Multi-Layer Ceramic) screening processes. It also teaches that the backing material prevents paste at the via holes from contacting the screening nest. And, that the backing material should also exhibit porosity or perforations for vacuum hold down of the green sheet and it should have non-porous edges for vacuum handling. Additionally, it discloses that the backing material utilized for this prior art screening processes should exhibit low static charge susceptibility, is smooth and planar, and is compatible with the screening paste used, and also exhibits dimensional stability.

In most of the prior art processes pits and/or depressions are commonly formed during the screening process. The formation of pits or depressions in the green sheet screening process is basically associated with volumetric changes during the drying of the paste. During the drying cycle the solvents are removed and the paste volume decreases. Additionally, pits are also formed if the interface between the paste and the backing film is somehow degraded. However, if the paste adheres to the backing film and it easily separates upon drying then pitting is minimized. This fixed interface forces the volumetric shrinkage to occur at the opposite surface of the green sheet which is the actual bottom surface of the top layer of the completed substrate.

The present invention relates to a new method and apparatus for the fabrication of green sheets for MLC applications which contain a flush, pit-free via surface. This is accomplished by applying a temporary electrostatic charge to the ceramic green sheet and a polymeric or insulating backing film. The electrostatic charge results in an electrostatic adhesion of the two layers or material. This adhesive force prevents the movement of the green sheet relative to the backing film, thus maintaining a good interface between the two films/sheets. After the screening process has been performed the electrostatic charge is removed and subsequently the backing layer is peeled off, leaving behind a green ceramic sheet with pit-free vias.

PURPOSES AND SUMMARY OF THE INVENTION

The invention is a novel method and an apparatus for using an electrostatic charge to provide adhesion between a green sheet and a backing layer during the screening process.

Therefore, one purpose of this invention is to provide an apparatus and a method that will provide electrostatic adhesion between the green sheet and the backing layer or the bi-layer during the screening process.

Another purpose of this invention is to provide for a pit free via formation in a green sheet.

Still another purpose of this invention is to have an economical way of making pit free vias in a green ceramic sheets.

Yet another purpose of this invention is to provide a way to remove the static charge from the bi-layer after the screening process.

Therefore, in one aspect this invention comprises a process for screening a green sheet using an electrostatic charge, comprising the steps of:

(a) placing said green sheet with at least one hole on at least one backing sheet, such that said backing sheet entirely covers said at least one hole and forms a bi-layer, (b) electrostatically charging said bi-layer, such that said backing sheet statically adheres to at least a portion of said green sheet, (c) screening said bi-layer with at least one metallic paste, such that said paste fills said at least one hole in said green sheet, (d) placing said bi-layer in an antistatic environment after said metallic paste has dried and removing said charge from said bi-layer, and (e) removing said backing layer and thereby completing the screening of a green sheet using an electrostatic charge.

In another aspect this invention comprises a bi-layer green sheet structure, comprising, (a) at least one green sheet with at least one via hole and at least one backing layer, (b) said at least one green sheet and said at least one backing layer being electrostatically charged, such that the electrostatic charge on said green sheet is opposite of the electrostatic charge on said backing layer, and (c) metallic paste in said at least one via.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

The prior art process of filling the via holes in most cases involves extruding a metal filled paste into the via holes either by using a stencil type mask or a mesh type mask. Since the metallurgical paste contains solvents which are required to achieve the necessary rheological behavior for screening, the paste must be dried after the vias have been filled in order to remove the above mentioned solvents.

During the drying of the metallurgical pastes, the solvents are removed and significant shrinkage of the paste can occur. This shrinkage is associated with the volumetric change resulting from capillary drying stresses during the solvent removal process. If allowed to occur freely, the shrinkage of the paste typically results in a structure that contains depressions and pits at the top and bottom surfaces of the via/green sheet.

Figure 1:
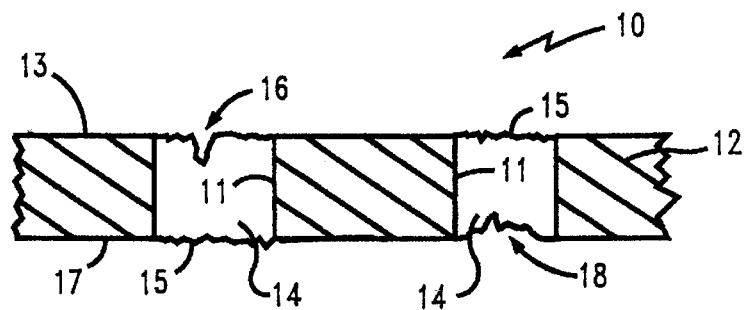
FIG. 1, illustrates a prior art green ceramic sheet having vias which have pits and depressions.

FIG. 1, shows a cross-section of a prior art ceramic substrate 10, having ceramic sheet 12, that has gone through a sintering cycle and has vias 14, which contain pits 16, on the upper surface 13, and depressions 18, on the bottom surface 17, of the ceramic sheet 12. The surface indicated by numeral 15, is a smooth via surface 15, which is presently not available all the time by the prior art methods and processes.

These depressions 18, and pits 16, can create significant problems if their size is sufficient to cause poor electrical and/or mechanical connection between the layers 12, during lamination or if the pits 16, are present at the surface after lamination.

Furthermore, open pits 16, at the surface of the vias 14, can trap fluids and debris after sintering, which could result in significant processing problems of the fired or sintered substrate. Ideally, a flush, dense surface of the paste in the via is required to achieve maximum electrical performance of MLC substrates, as shown by the surface 15.

Several techniques can be used to reduce or eliminate capillary stress and shrinkage associated with solvent removal during drying. These techniques typically involve altering the surface energies of the system by using surfactants or super critical drying processes. However, these techniques are typically not suitable to the processing of green sheets for MLC applications. As such, a technique which can control the localized drying of the paste at the free surfaces such that pits or depressions are eliminated, without affecting the green sheet, would be very beneficial.

However, one solution to this problem could be to simply apply an adhesive (not shown) to a backing film, in order to aid in the maintenance between the green sheet 12, and the backing film. While this approach is technically feasible, removal of the adhered backing film, after screening could result in stretching or distortion of the green sheet 12, or in significant damage to the green sheet 12, and the paste, which is similar to the one shown in FIG. 1. This of course negates the usefulness of this approach.

Thus there is a need to invent a technique to reduce or eliminate the formation of drying pits or depressions, that may form in a ceramic green sheet.

Figure 2:
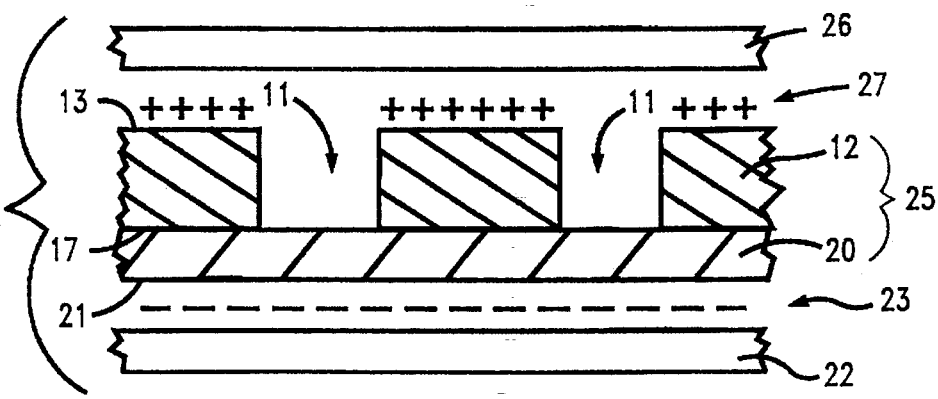
FIG. 2, illustrates a side view of the preferred embodiment of this invention during the electrostatic charging process.

FIG. 2, illustrates the preferred embodiment of this invention. A standard ceramic green sheet 12, having holes or openings 11, is placed onto a backing film or layer 20, to form a bi-layer 25. It is highly desirable that the backing film 20, is insulative and non-conductive. The material for the backing film could be made from a group comprising latex, poly(alkenes), polyester, polymeric material, polyimide, rubber, to name a few. An insulative polymer by the tradename MELINEX, could also be used as a backing layer. However, it should be understood that any backing layer that is used, must be non-conductive or insulative in order to maintain the electrostatic charge.

Using charge bars 22 and 26, electrostatic charge is provided to the ceramic green sheet 12, and the backing film 20, to form a temporary attractive force between the green sheet 12, and the backing film 20, that is used for the screening process. The charge bars 22 and 26, can be AC or DC charge bars. However, at least one charge bar 22 or 26, needs to be a DC source, while the other bar can be an AC or DC charge bar.

Actual polarity of the charging is not critical as long as sufficient charge is applied to temporarily adhere the backing film 20, to the green sheet 12. As shown in FIG. 2, the positive charge 27, has been applied to the surface 13, of the green sheet 12, while negative charge 23, has been applied to the surface 21, of the backing film 20.

Any movement between the green sheet 12, and the backing film 20, during the actual screening operation could result in a degradation to the metallurgical paste/backing film interface.

Furthermore, maintaining a good interface between the green sheet 12, and the backing film 20, is very critical during the drying of the paste, because once the interface is compromised, the paste is free to shrink away from the backing film 20, resulting in drying pits. Thus, the better the interface between the backing film 20, and the green sheet/paste 12, the lower the level of drying pits.

The amount of charge 23 and 27, can be tailored to the process by controlling the applied voltages to the charging bars 22 and 26, respectively. Voltages as high as 20,000 to 30,000 volts can and have been used. Since the green sheet 12, and the backing film 20, are insulators, the charge is stable over a long period of time and is difficult to remove during normal processing and handling since the overall bi-layer 25, (green sheet and backing film) is essentially neutral in charge.

Once the bi-layer 25, has been charged, the adhesion between the green sheet 12, and backing film 20, is such that the movement of the two relative to each other is essentially eliminated during normal handling.

Figure 3:
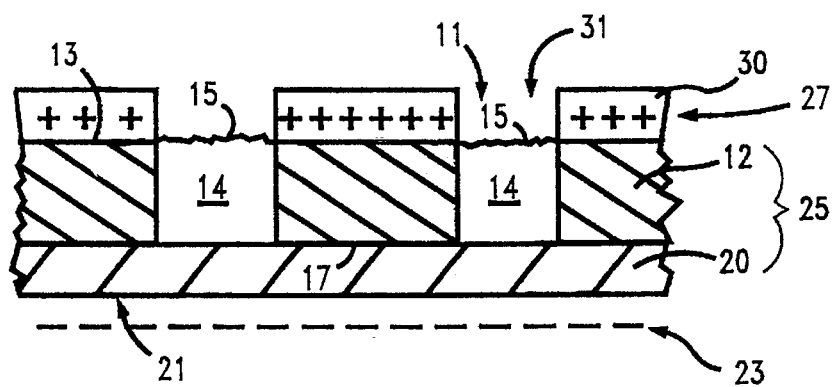
FIG. 3, illustrates a side view of the invention of FIG. 2, after a screening mask has been placed over the green sheet.

The bi-layer 25, containing the charged green sheet 12, and the charged backing film 20, is now ready for the next processing step, as shown in FIG. 3. Screening of the green sheet 12, is performed using standard processes, such as, placing a stencil type screening mask 30, over the charged surface 13, of the green sheet 12, and screening metallic paste 14, through an opening 31, in the mask 30, into the opening or via holes 11, of the green sheet 12, as shown in FIG. 3. Care should be taken that the paste 14, does not overflow out of the via opening 11.

The screening paste 14, is typically selected from a group comprising copper, gold, molybdenum, nickel, platinum, silver, tungsten, or alloys thereof, to name a few.

After the screening process, the bi-layer 25, containing the metallurgical paste 14, is dried using standard drying methods and conditions.

The electrostatic charge 27 and 23, between the green sheet 12, and the backing film 20, remains during the drying operation, thus maintaining little or no movement of the green sheet 12, on the backing film 20. This reduces or eliminates separation of the metallic paste 14, from the backing film 20, during the drying of the paste 14. Sufficient adhesion of the metallic paste 14, to the backing film 20, typically will occur to prevent separation between the two, as long as the interface is not mechanically compromised by sheet movement.

Figure 4:
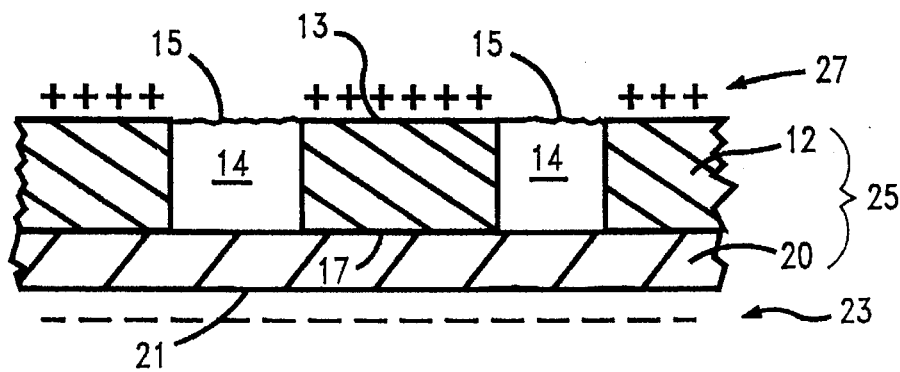
FIG. 4, shows the bi-layer having the electrostatic charge after via holes in the green sheet have been filled.

As stated earlier and as shown in FIG. 4, that due to the electrostatic charge the bi-layer 25, comprising the green sheet 12, and backing film 20, will maintain very close adherence even after the screening and the drying of the paste in the via process. It should be emphasized that the bi-layers 25, still contains significant amounts of electrostatic charge at this point. In fact, removal of the backing film 20, without charge neutralization can result in damage to the via 14, due to pulling out of dried paste 14.

Figure 5:
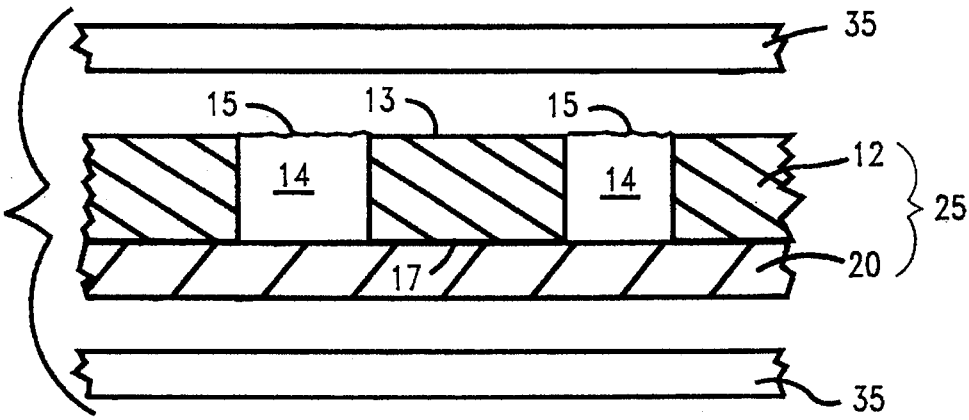
FIG. 5, is a side view of the inventive bi-layer during the electrostatic discharge process.

To eliminate this problem, as shown in FIG. 5, the bi-layer 25, is first discharged by passing the bi-layer 25, through two AC antistatic bars 35, or by using an antistatic ion gun 35. Both of these devices flow large amounts of positive and negative ions over both surfaces 13 and 21, of the bi-layer 25. This effectively neutralizes the charge 23 and 27, on the bi-layer 25.

Figure 6:
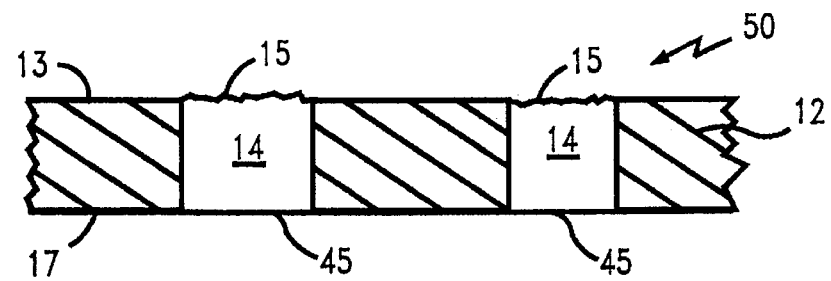
FIG. 6, is a side view of the green ceramic sheet after the backing layer has been removed.

As illustrated in FIG. 6, that once the charge 23 and 27, has been neutralized, the backing film 20, can be simply and easily removed which results in a green ceramic layer 50, having a ceramic layer 12, with at least one via 14. Wherein the via 14, has a flush, pit and depression free via surface 15, at the upper surface 13, and has a smooth, flush, pit and depression free surface 45, at the lower surface 17. However, in some cases it may have some depressions on the free surface. It should be noted that the smooth surface 45, basically is due to the presence of the backing layer 20, that was electrostatically adhered to the surface 17, of the green ceramic sheet 12.

It should also be appreciated that the use of electrostatic attraction to hold the ceramic layer and the backing layer is completely reversible, and no chemical residues are left at the end of the process.

The backing film should be selected to be sufficiently resistant to screening and/or drying temperature and pressure conditions, and also remain adhered to the ceramic green sheet. The backing film should also be removable from the green ceramic sheet after screening without causing any damage to the screened green sheet.

For most applications it is preferred that the green sheet is a ceramic green sheet. However, the green sheet could be selected from a group comprising aluminum nitride, aluminum oxide, glass-ceramic, to name a few.

The electrostatic charge provides a very good adhesive force and prevents any movement of the green sheet relative to the backing film, thus maintaining a very good interface between the green sheet and the backing layer. The elimination of the movement at the interface of the backing material and the green sheet is very critical for the production of the pit-free vias. Therefore, the electrostatic charge that is applied to the bi-layer must be such that there is no movement between the bi-layers.

This invention also enables the placement of controllable amount of static charge on both sides of the bi-layer. This results in a controlled static adhesion between the two materials of the bi-layer and which is also reversible.

It should be understood that the electrostatic charge should be high enough to provide good electrostatic adhesion between the backing layer and the green sheet. A low electrostatic charge will not be strong enough to hold the backing layer and the green sheet together throughout the screening process. Therefore, the preferred electrostatic charge is at least 1,000 volts, however, for most applications the electrostatic charge should be between about 1,000 volts and about 100,000 volts, preferably between about 10,000 volts and about 50,000 volts, and more preferably between about 20,000 volts and about 40,000 volts.

It should be appreciated that some of the green ceramic sheets do acquire an electrostatic charge during normal processing. However, while using this invention all green ceramic sheets should pass through an antistatic environment prior to charging of the bi-layer, so that the only charge present on these green sheets are the electrostatic charge that has been applied using the process of this invention.

It should also be noted that this invention provides a chemical free adhesion during the screening process, as no adhesive chemical residue gets transferred from any of the layers. And, also the adhesion is completely reversible, i.e., it does not matter what the polarity of charge is applied to any of the layers, as long as the second charge is the opposite of the first charge.

EXAMPLE

The following example is intended to further illustrate the invention and is not intended to limit the scope of the invention in any manner.

EXAMPLE 1

To demonstrate the effectiveness of this invention, a controlled experiment was run using electrostatic adhesion and comparing this to uncharged green sheets.

Two control samples were processed. The first control samples were processed by the prior art methods and it was found that on an average the first control samples had a 71 percent pitting level. On the other hand when the second set of controlled samples were processed with the method of this invention, that is, the backing layer and the ceramic layer were electrostatically charged, the pitting level was only 3 percent.

These values were typical and apply only to the controlled experiments run for the evaluations. Actual ranges will depend on numerous processing variables and as such, these data should be used only for comparison purposes.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for screening a green sheet using an electrostatic charge, comprising the steps of:
   (a) placing said green sheet with at least one hole on at least one backing sheet, such that said backing sheet entirely covers said at least one hole and forms a bi-layer,
   (b) electrostatically charging said bi-layer, such that said backing sheet statically adheres to at least a portion of said green sheet,
   (c) screening said bi-layer with at least one metallic paste, such that said paste fills said at least one hole in said green sheet,
   (d) placing said bi-layer in an antistatic environment after said metallic paste has dried and removing said charge from said bi-layer, and
   (e) removing said backing layer and thereby completing the screening of a green sheet using an electrostatic charge.

2. The process of claim 1, wherein said green sheet is selected from a group consisting of aluminum nitride, aluminum oxide, ceramic or glass-ceramic.

3. The process of claim 1, wherein said backing material is selected from a group consisting of latex, poly(alkenes), polyester, polymeric material, polyimide or rubber.

4. The process of claim 1, wherein said electrostatic charge is between about 1,000 volts and about 100,000 volts, preferably between about 10,000 volts and about 50,000 volts, and more preferably between about 20,000 volts and about 40,000 volts.

5. The process of claim 1, wherein said antistatic environment is provided by at least two antistatic bars.

6. The process of claim 1, wherein said screening paste is selected from a group consisting of copper, gold, molybdenum, nickel, platinum, silver, tungsten, or alloys thereof.

7. The process of claim 1, wherein the surface of said dried metallic paste is flushed smooth with the surface of said green sheet.

* * * * *